United States Patent [19]
Seeman

[11] Patent Number: 6,068,889
[45] Date of Patent: *May 30, 2000

[54] METHOD FOR LUBRICATING GLASS MOLDS, PLUNGERS AND THE LIKE

[76] Inventor: Thomas A. Seeman, 3946 Kimberton, Toledo, Ohio 43614

[*] Notice: This patent is subject to a terminal disclaimer.

[21] Appl. No.: 09/382,226

[22] Filed: Aug. 24, 1999

Related U.S. Application Data

[63] Continuation of application No. 09/175,653, Oct. 20, 1998, abandoned.

[51] Int. Cl.[7] .............................. B05D 1/08; C23C 16/26
[52] U.S. Cl. ..................... 427/446; 427/450; 427/133; 427/223; 427/249.6; 65/24; 65/26; 65/170
[58] Field of Search .................................. 427/446, 450, 427/133, 249.6, 223; 65/24, 26, 170

[56] References Cited

U.S. PATENT DOCUMENTS

| | | |
|---|---|---|
| 1,474,009 | 11/1923 | Straw . |
| 1,595,382 | 8/1926 | Coberly . |
| 4,333,756 | 6/1982 | Seeman . |
| 4,412,974 | 11/1983 | Nicolas et al. . |
| 4,498,918 | 2/1985 | Seeman . |
| 4,806,137 | 2/1989 | Virey . |
| 5,006,321 | 4/1991 | Dorfman et al. . |
| 5,679,409 | 10/1997 | Seeman . |

*Primary Examiner*—Fred J. Parker
*Attorney, Agent, or Firm*—John C. Purdue; David C. Purdue

[57] ABSTRACT

A method for lubricating glass contacting surfaces of glass forming equipment is disclosed. The method comprises the steps of delivering MAPD gas to a venturi at a low pressure, preferably below 10 p.s.i., and delivering oxygen to the venturi at a lower pressure, usually half or less than half of the pressure at which the MAPD gas is delivered to the venturi. The MAPD gas and the oxygen are mixed in the venturi and delivered to and through a nozzle which is directed toward a glass contacting surface. The mixture is ignited as it leaves the nozzle; its flow is controlled so that the temperature of the flame is between approximately 1500 and 1800 degrees K. By controlling the temperature of the flame, the method is operable to deposit on the glass contacting surface a lubricating coating of graphite including a substantial percentage of flat plate graphite. Also disclosed is a method which involves mixing up to about 5 percent by volume of acetylene with the MAPD gas, before the latter is mixed with oxygen gas; the acetylene-containing mixture produces a longer flame, which is capable of reaching the bottoms of relatively deep molds, than does a mixture of MAPD gas and oxygen. In some situations, for example, lubricating conveyor belts for transporting hot glass, natural gas is substituted for the oxygen and lubrication is achieved with less use of the MAPD gas.

3 Claims, 2 Drawing Sheets

METHOD FOR LUBRICATING GLASS MOLDS, PLUNGERS AND THE LIKE

This is a continuation of U.S. patent application Ser. No. 09/175,653 filed Oct. 20, 1998, abandoned.

REFERENCE TO RELATED PATENT

This is related to U.S. Pat. No. 5,679,409, differing therefrom in disclosing and claiming an improvement which is neither disclosed nor claimed in said patent.

FIELD OF THE INVENTION

This invention relates to a method for lubricating glass forming equipment and, specifically, to a method for lubricating the glass contacting surfaces of such equipment.

BACKGROUND OF THE INVENTION

The glass contacting surfaces of glass forming equipment need to be lubricated to prevent the glass from sticking to the surfaces. Various methods have been used to provide the needed lubrication, usually in the form of a carbon layer on the glass contacting surfaces.

For decades, glass manufacturers have lubricated glass contacting surfaces by dabbing them intermittently with a suspension of graphite in oil. When the hot glass contacts the dabbed surfaces, the oil is burned leaving a graphite coating on the surface. This has been demonstrated to provide acceptable lubrication to prevent glass from sticking to the surfaces but the method suffers from a number of drawbacks. The manual dabbing of mold surfaces is labor intensive and is fraught with danger from the close proximity between operators who apply the oil and graphite to the glass contacting surfaces and the hot glass and the hot glass forming equipment. In addition, the oil in which the graphite is suspended burns when contacted by hot glass. This oil combustion is not complete and, as a result, substantial amounts of smoke and soot are produced when this lubricating method is used. The problems of smoke and soot are especially dangerous in wood buildings where smoke and soot rise with the hot air currents and form deposits on the roof and rafters. Roof fires are a common and pervasive problem in glass factories where oil and graphite lubricants are used. Some factories are known to have fires every few months, despite the fact that the roof and rafters are sprayed with water, regularly. Aside from the problem with fires, oil and graphite lubricants create substantial pollution problems which are subject to increasingly stringent controls.

U.S. Pat. No. 4,806,137 discloses the use of a hydrocarbon containing fuel mixed with large volumes of oxygen to lubricate the glass contacting surfaces of glass forming equipment. According to the patent, at least one gaseous hydrocarbon is injected through an oxyfuel flame having a temperature higher than 2000 degrees Kelvin to produce a porous layer of carbonaceous particles on the glass contacting surface. The carbon layer deposited on hot glass is said to be capable of burning in air.

U.S. Pat. No. 4,498,918 discloses the use of a mixture of methyl acetylene and propadiene (hereinafter "MAPD gas") and at least one hydrocarbon having an acetylenic triple bond to lubricate a mold cavity. The patent does not disclose or suggest the use of a mixture of MAPD gas and oxygen to lubricate glass contacting surfaces.

U.S. Pat. No. 5,679,409 discloses a method for lubricating glass contacting surfaces of glass forming equipment. The method comprises the steps of delivering MAPD gas to a venturi at a low pressure, preferably below 10 p.s.i., and delivering oxygen to the venturi at a lower pressure, usually half or less than half of the pressure at which the MAPD gas is delivered to the venturi. The MAPD gas and the oxygen are mixed in the venturi and delivered to and through a nozzle which is directed toward a glass contacting surface. The mixture is ignited as it leaves the nozzle; its flow is controlled so that the temperature of the flame is between approximately 1500 and 1800 degrees K. By controlling the temperature of the flame, the method is operable to deposit on the glass contacting surface a lubricating coating of graphite including a substantial percentage of flat plate graphite. In some situations, for example, lubricating conveyor belts for transporting hot glass, natural gas is substituted for the oxygen and lubrication is achieved with less use of the MAPD gas.

SUMMARY OF THE INVENTION

The present invention is a method for lubricating glass contacting surfaces of glass forming equipment. The method comprises the steps enumerated above as disclosed in U.S. Pat. No. 5,679,409 of delivering MAPD gas to a venturi at a low pressure, preferably below 10 p.s.i., and delivering oxygen to the venturi at a lower pressure, usually half or less than half of the pressure at which the MAPD gas is delivered to the venturi. The MAPD gas and the oxygen are mixed in the venturi and delivered to and through a nozzle which is directed toward a glass contacting surface. The mixture is ignited as it leaves the nozzle; its flow is controlled so that the temperature of the flame is between approximately 1500 and 1800 degrees K. By controlling the temperature of the flame, the method is operable to deposit on the glass contacting surface a lubricating coating of graphite including a substantial percentage of flat plate graphite. The invention also includes a step, which is not suggested in U.S. Pat. No. 5,679,409, of mixing up to 5 percent by volume of acetylene gas with the MAPD gas, based upon the total volume of acetylene gas and MAPD gas, that is mixed with oxygen gas and directed through the nozzle. It has been found that the flame produced when mixtures of the MAPD gas and of oxygen gas are directed toward a glass contacting surface is not long enough to reach the bottoms of comparatively deep molds and that the flame length can be increased by adding acetylene to the MAPD gas. Further, the length of the flame increases as a direct function of the proportion of acetylene added to the MAPD gas. Accordingly, when a comparatively deep mold is being lubricated, acetylene gas is preferably mixed with the MAPD gas, and the proportion is controlled so that the flame produced by the combustion of the gas mixture has a desired length. Furthermore, the mixture of MAPD gas and a small percentage of acetylene deposits a sufficient amount of carbon on the mold surface for release of a formed glass article from the mold, but does not cause the carbon build-up that occurs when acetylene alone is used for mold lubrication.

DETAILED DESCRIPTION OF THE INVENTION

Figure 1:
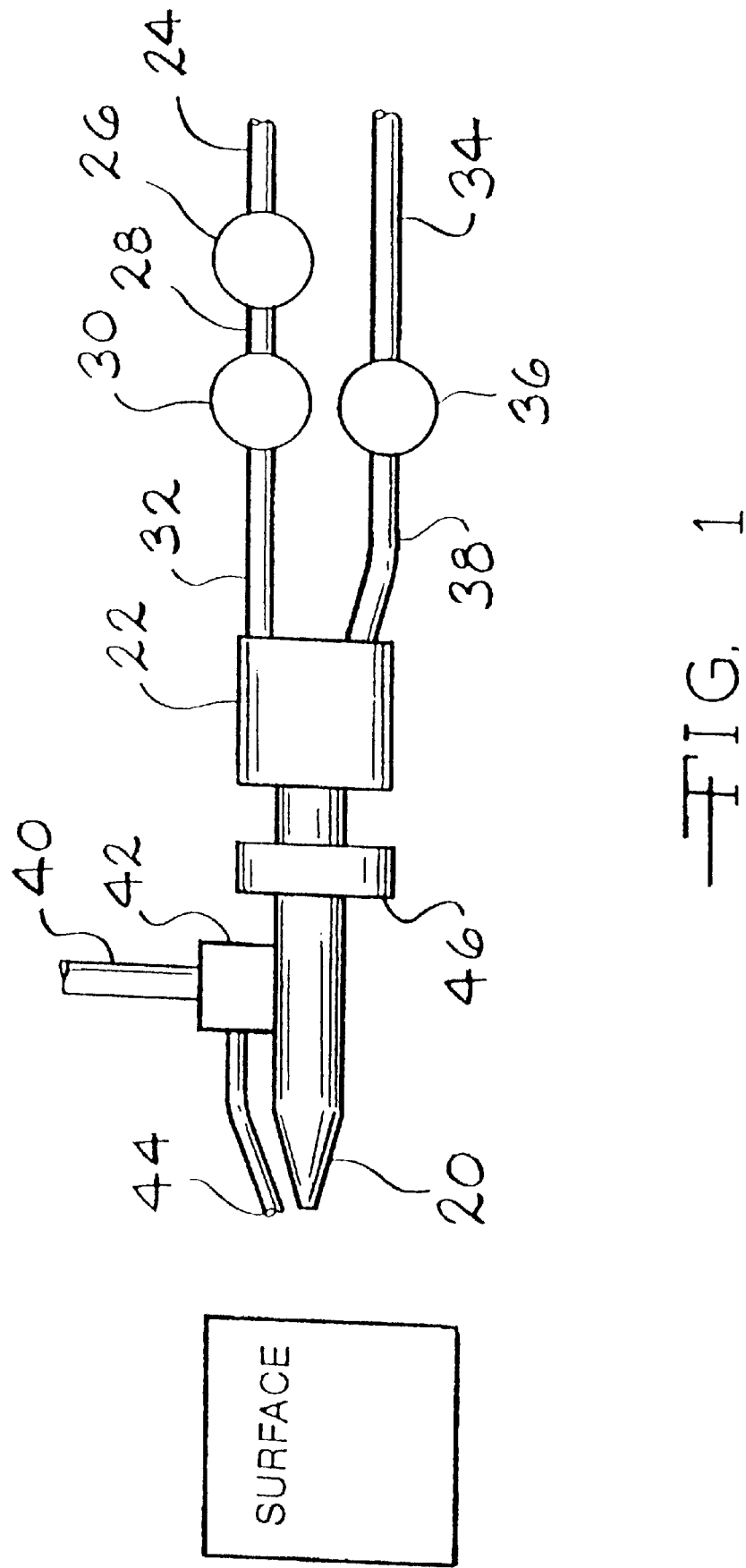
FIG. 1 is a schematic view of apparatus useful in carrying out the method of the present invention.

The present invention is a method for lubricating glass contacting surfaces of glass molding and pressing equipment. According to the method, a lubricating gas mixture comprising MAPD gas or its equivalent and oxygen is delivered through a nozzle and ignited so that the flame is directed to a glass contacting surface. The flame is operable to deposit a layer of graphite comprising a substantial portion of flat plate graphite on the glass contacting surface. MAPD gas streams are available from Petromont of Canada; they generally comprise mixtures of 41 to 65 weight percent of methyl acetylene with propadiene and other C3 hydrocarbons and C4 hydrocarbons, stabilized with propane.

According to the present method, the constituents of the lubricating gas mixture are controlled so that the temperature of the flame is between 1500 and 1800 degrees K. As a consequence, the combustion of the gas mixture is operable to deposit carbon on glass contacting surfaces and, specifically, carbon comprising a substantial proportion of flat plate graphite. It has been determined that flat plate graphite provides significantly better lubrication than crystal graphite which is produced in substantial quantities during the combustion of a lubricating gas mixture containing large amounts of oxygen, as taught in U.S. Pat. No. 4,806,137.

In practicing the method of the present invention, a mixture of MAPD gas and oxygen or MAPD gas and natural gas is delivered to and through a nozzle 20 at low pressures, usually in the range of 1 to 5 pounds per square inch (hereinafter "psi"; all pressures herein are pressures gage, i.e., above atmospheric) and, preferably, at about 3 psi. The nozzle 20 is positioned, relative to a glass contacting surface, designated SURFACE in the drawing, so that a flame from the combustion of the lubricating gas mixture is directed towards the SURFACE and is operable to deposit a lubricating coating of carbon on the SURFACE. The SURFACE may be any glass contacting surface in glass forming equipment including, but not limited to, mold surfaces, press surfaces, plunger surfaces, belt surfaces and glass contacting surfaces of glazer formers.

The oxygen in the lubricating gas mixture can be supplied from an oxygen tank which delivers oxygen at a high pressure, frequently in the vicinity of 90 psi. Oxygen is delivered to a venturi 22, flowing thereto through a hose 24, which it enters at a high pressure. Before the oxygen is delivered to the venturi 22, its pressure is reduced, first by a regulator 26, which can be a Matheson 8-2 regulator, or its equivalent, from approximately 90 psi. to approximately 10 psi. A conduit 28 delivers the reduced pressure oxygen from the regulator 26 to a second regulator 30, preferably, a Matheson Model 3700 Pancake Regulator or its equivalent, which further reduces the pressure of the oxygen to approximately 1 to 5 psi and, more preferably, to 2 to 4 psi. Oxygen is delivered from the regulator 30 through a conduit 32 to the venturi 22 where it is mixed with MAPD gas, before the mixture is delivered to and through the nozzle 20.

MAPD gas or its equivalent is delivered from a tank (not shown) to the venturi 22, flowing through a conduit 34, a pressure regulator 36 and a conduit 38. The pressure of the MAPD gas delivered to the venturi 22 is preferably at least twice the pressure at which oxygen is delivered to the venturi 22, so as to prevent backfiring of the mixture within the nozzle 20. If oxygen is delivered at a pressure exceeding one half of the pressure at which the MAPD gas is delivered to the venturi 22, there will be a tendency for the mixture to backfire within the nozzle 20.

Accordingly, the delivery pressures of the MAPD gas and the oxygen are controlled to substantially eliminate backfiring in the nozzle 20.

The nozzle 20 includes means for producing a natural gas pilot flame. These means include a conduit 40 for receiving natural gas or its equivalent from a suitable source (not shown) therefore. The natural gas is delivered through a valve 42 to an outlet 44. When the valve 42 is open, gas flows through the outlet 44 and, when ignited, provides a pilot flame for igniting the lubricating gas mixture delivered through the nozzle 20.

Figure 2:
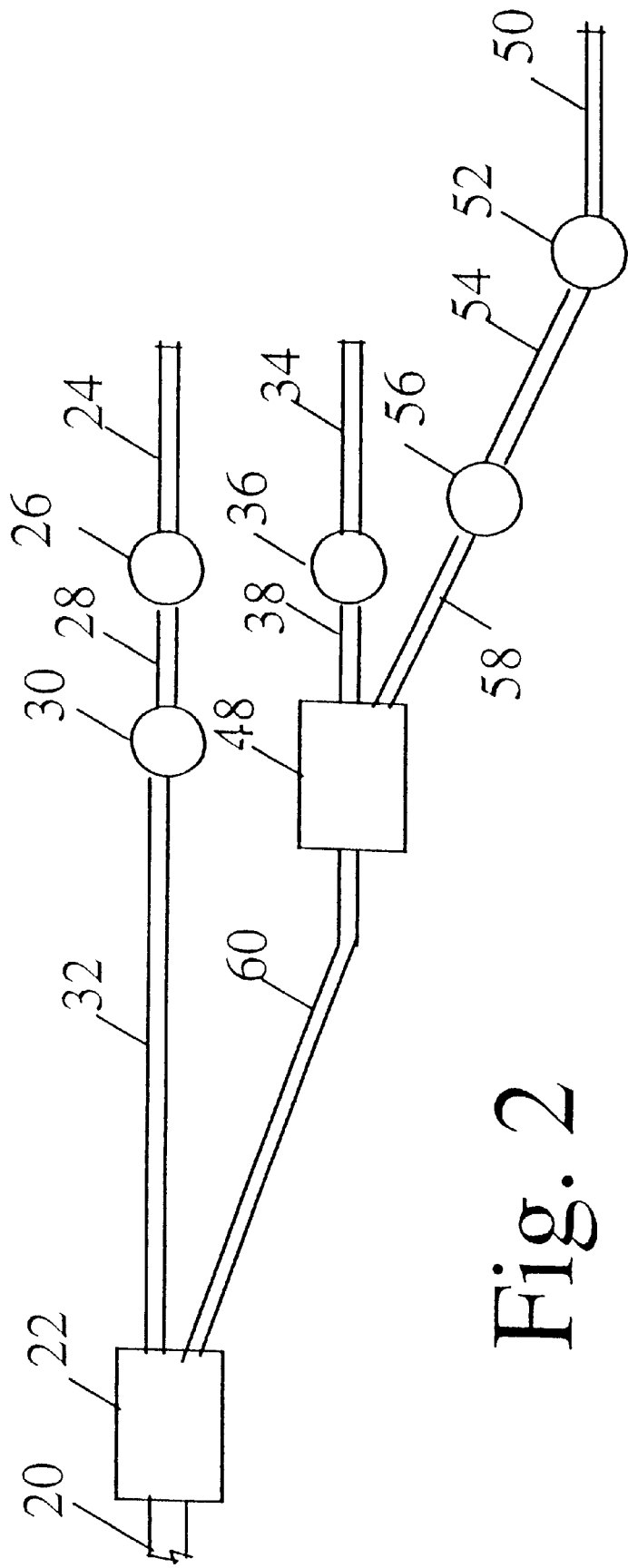
FIG. 2 is a schematic view similar to FIG. 1 of apparatus which includes means for mixing acetylene with MAPD gas in practicing the invention.

The apparatus of FIG. 2 is similar to that of FIG. 1, including the venturi 22 into which oxygen flows, entering at a high pressure through the hose 24, and flowing through the regulators 26 and 30, where its pressure is reduced as previously described from approximately 90 psi. to approximately 1 to 5 psi, and the conduit 32 to the venturi 22.

MAPD gas or its equivalent flows through the conduit 34, the pressure regulator 36 and the conduit 38 to a venturi 48 where it is mixed with acetylene gas when a comparatively long flame is required. The acetylene gas flows from a tank (not shown) through a line 50, a regulator 52, a the 54, a valve 56 and a line 58 to the venturi 48 where it is mixed with the MAPD gas. The mixture of MAPD gas and acetylene flows from the venturi 48 through a line 60 to the venturi 22. The pressure of the MAPD gas or of the mixture of MAPD gas and acetylene delivered to the venturi 22 is preferably at least twice the pressure at which oxygen is delivered to the venturi 22, so as to prevent backfiring of the mixture within the nozzle 20. The valve 56 is either closed so that only MAPD gas or a mixture of MAPD gas and up to 5 percent by volume of acetylene gas is delivered to the venturi 22.

The method of the invention can be practiced with either continuous or intermittent delivery and combustion of the gas mixture through the nozzle 20. A timing valve device, indicated generally at 46, can be connected to receive a signal from a portion of the glass forming equipment (not shown) so that it can interrupt the flow of the lubricating gas mixture through the nozzle 20 to provide intermittent lubrication of a glass contacting surface. Apparatus for interrupting the flow of a gas in response to a sensed condition is known and forms no part of the present invention.

DESCRIPTION OF THE PREFERRED EMBODIMENTS

The following examples are presented solely for the purpose of illustrating and disclosing the invention, and are not intended to be limiting.

EXAMPLE I

The method of the present invention was employed to lubricate mold surfaces in a Hartford 28 machine. Apparatus corresponding generally with the apparatus illustrated in FIG. 1 was utilized to deliver a lubricating gas mixture comprising MAPD gas and oxygen through a nozzle positioned so that the flame of the lubricating gas mixture was operable to deposit a lubricating coating comprised of a substantial proportion of flat plate graphite on the molds of the Hartford machine. Specifically, the mixture comprised 67 volume percent of MAPD gas and 33 volume percent of oxygen. The oxygen was delivered to a mixing venturi at approximately 3 psi and the MAPD gas was delivered to the venturi at approximately 6 psi.

The lubricating gas mixture was delivered through the nozzle continuously at a rate such that approximately 12 cubic feet of the mixture were delivered through the nozzle per hour. Even after several hours of continuous lubrication, the temperature of the flame from the combustion of the lubricating gas mixture remained less than 1800 degrees Kelvin. The combustion of the gas was operable to deposit a layer of carbon comprised of a substantial proportion of flat plate graphite on the mold surfaces.

EXAMPLE II

The method of the present invention was employed to lubricate glass contacting surfaces in a Lynch Press. Apparatus corresponding generally with the apparatus illustrated in FIG. 1 was utilized to deliver a mixture of MAPD gas and oxygen through a nozzle positioned so that the flame of the lubricating gas mixture was operable to deposit a lubricating coating comprised of a substantial proportion of flat plate graphite on the glass contacting surfaces of the Lynch Press. Specifically, the mixture comprised 80 volume percent of MAPD gas and 20 volume percent of oxygen.

The lubricating gas mixture was delivered through the nozzle continuously at a rate such that approximately 15 cubic feet of the mixture were delivered through the nozzle per hour. Even after several hours of continuous lubrication, the temperature of the flame from the combustion of the lubricating gas mixture remained less than 1800 degrees Kelvin. The combustion or the gas was operable to deposit a layer of carbon comprised of a substantial proportion of flat plate graphite on the mold surfaces. The lubricated surfaces performed very well and the glass produced was clean and smooth.

EXAMPLE III

The method of the present invention was employed to lubricate glass contacting surfaces in a glazer former machine. Apparatus corresponding generally with the apparatus illustrated in FIG. 1 was utilized to deliver a mixture of MAPD gas and oxygen through a nozzle positioned so that the flame of the lubricating gas mixture was operable to deposit a lubricating coating comprised of a substantial proportion of flat plate graphite on the glass contacting surfaces of the glazer former machine. Specifically, the mixture comprised 67 volume percent of MAPD gas and 33 volume percent of oxygen.

The lubricating gas mixture was delivered through the nozzle continuously at a rate such that approximately 12 cubic feet of the mixture were delivered through the nozzle per hour. Even after several hours of continuous lubrication, the temperature of the flame from the combustion of the lubricating gas mixture remained less than 1800 degrees Kelvin. The combustion of the gas was operable to deposit a layer of carbon comprised of a substantial proportion of flat plate graphite on the glass contacting surfaces.

EXAMPLE IV

The method or the present invention was employed to lubricate glass transporting belts in glass forming equipment. Multiple nozzles corresponding generally with the nozzle 20 illustrated in FIG. 1 were utilized to deliver a mixture of MAPD gas, natural gas and oxygen through a nozzle positioned so that the flame of the lubricating gas mixture was operable to deposit a lubricating coating comprised of a substantial proportion of flat plate graphite on the belts of the glass forming equipment. Specifically, the mixture comprised substantially one and one half volumes of MAPD gas and of natural gas and two volumes of oxygen. The nozzles had small outlet orifices, by comparison with conventional nozzles. Specifically, the nozzles had outlet orifices with diameters between twenty thousandths and thirty thousandths of an inch, compared to nozzles with diameters of fifty-five thousandths.

The lubricating gas mixture was delivered through the nozzles continuously at a rate such that approximately 5 cubic feet of the mixture were delivered through each nozzle per hour. Even after several hours Of continuous lubrication, the temperature of the flame from the combustion of the lubricating gas mixture remained less than 1800 degrees Kelvin. The combustion of the gas was operable to deposit a layer of carbon comprised of a substantial proportion of flat plate graphite on the belt surfaces.

Example V

The method of the present invention was employed to lubricate the interior of a mold in which glass tumblers having a depth of about seven inches were being produced in an H-28 machine. Apparatus corresponding generally with that shown in FIG. 2 was utilized to deliver a mixture of MAPD gas, acetylene gas and oxygen gas through a nozzle positioned so that the flame of the lubricating gas mixture was operable to deposit on the interior of the tumbler mold and on the cooperating plunger a lubricating coating comprised of a substantial proportion of flat plate graphite on the interior of the mold. The lubricating coating extended to the bottom of the tumbler mold. The mixture discharged from the nozzle contained 65 volume percent of MAPD gas, 5 volume percent of acetylene and 30 volume percent of oxygen.

The lubricating gas mixture was delivered through the nozzle continuously at a rate such that approximately 18 cubic feet of the mixture were delivered through the nozzle per hour. Even after several hours of continuous lubrication, the temperature of the flame from the combustion of the lubricating gas mixture remained less than 1800 degrees Kelvin. The combustion of the gas was operable to deposit a layer of carbon comprised of a substantial proportion of flat plate graphite on the glass contacting surfaces.

Thus, it will be seen that the present invention provides excellent and clean lubrication for a variety of glass contacting surfaces. By comparison with the method disclosed in U.S. Pat. No. 4,806,137, where large volumes of oxygen are mixed with, for example, acetylene to produce a flame having a temperature in excess of 2000 degrees Kelvin, the present invention uses small amounts of oxygen to produce a cooler flame. Because the flame is cooler, combustion of a lubricating gas mixture according to the present invention produces a graphite coating comprising a substantial proportion of flat plate graphite which provides better and smoother lubrication of glass contacting surfaces than crystal graphite. Moreover, the lower temperature of the flame from combustion of a lubricating gas mixture according to the present invention allows for faster operation of glass forming equipment. In contrast, the method disclosed in U.S. Pat. No. 4,806,137 involves much higher temperatures which will necessarily limit the speed at which glass forming equipment can be operated without overheating.

The present method provides advantages over the known use of MAPD gas alone to lubricate glass contacting surfaces. The addition of small amounts of oxygen to MAPD gas prior to combustion produces a flame with a much better penetrating characteristic than MAPD gas alone. Accordingly, the present invention is especially suited for use with deep and/or intricate molds. The lubricating gas mixture of the present invention is extremely clean burning with a minimum of pollution and, when the lubricating gas mixture includes natural gas, there is even less pollution than when the lubricating gas mixture comprises MAPD and oxygen alone.

It will be appreciated that the present invention is a method for lubricating glass contacting surfaces of glass forming equipment. The method comprises the steps of delivering MAPD gas to a venturi at a low pressure, preferably below 10 p.s.i., and delivering oxygen to the venturi at a lower pressure, usually is half or less than half of the pressure at which the MAPD gas is delivered to the venturi. The MAPD gas and the oxygen are mixed in the venturi and delivered to and through a nozzle which is directed toward a glass contacting surface. The mixture is ignited as it leaves the nozzle; its flow is controlled so that the temperature of the flame is between approximately 1500 and 1800 degrees K. By controlling the temperature of the flame, the method is operable to deposit on the glass contacting surface a lubricating coating of graphite including a substantial percentage of flat plate graphite. In some situations, for example, lubricating conveyor belts for transporting hot glass, natural gas is substituted for all or a part of the oxygen and lubrication is achieved with less use of the MAPD gas. In a preferred embodiment, the gas mixture directed to and through the nozzle contains from 60 to 85 percent by volume of MAPD gas and from 20 to 45 percent by volume of oxygen. In another preferred embodiment, the gas mixture directed to and through the nozzle contains from 40 to 60 percent by volume of MAPD gas and from 60 to 40 percent by volume of natural gas. Most desirably, the mixture directed through the nozzles, when it contains from 40 to 60 percent by volume of MAPD gas and from 60 to 40 percent by volume of natural gas, additionally contains enough oxygen that its oxygen content is from 35 to 45 percent by volume.

We claim:

1. A method for lubricating a surface which comes into contact with hot glass by producing thereon a layer of lubricous graphite, said method comprising the steps of mixing a methyl acetylene/propadiene gas at a first pressure which is less than 10 pounds per square inch gauge with oxygen gas at a second pressure which is less than said first pressure, directing the resulting gas mixture to and through a nozzle and toward a surface of it glass forming apparatus which contacts hot glass, igniting the gas mixture to form a flame produced by the combustion of the gas mixture which deposits a lubricating coating of graphite on the surface of the glass forming apparatus which contacts hot glass, controlling the gas flows so that the second pressure is sufficiently less than the first pressure that the gas mixture does not backfire within the nozzle when the flow of the gas mixture is stopped, and controlling the composition of the gas mixture and the rate at which it is discharged from the nozzle so that the flame produced by the combustion of the gas mixture does not exceed a temperature of 2000 degrees Kelvin, wherein up to 5 percent by volume of acetylene gas is mixed with the methyl acetylene/propadiene gas, based upon the total volume of acetylene gas and methyl acetylene/propadiene gas that is mixed with oxygen gas and directed through the nozzle, and the proportion of acetylene gas so mixed is controlled so that the flame produced by the combustion of the gas mixture has a desired length.

2. A method as claimed in claim 1 wherein the composition of the gas mixture and the rate at which is discharged front the nozzle are controlled so that the flame produced by the combustion of the gas mixture is at a temperature from 1500 to 1800 degrees Kelvin.

3. A method as claimed in claim 2 wherein the gas mixture directed to and through the nozzle contains from 60 to 85 percent by volume of methyl acetylene/propadiene gas and from 20 to 45 percent by volume of oxygen.

* * * * *